United States Patent
Zoellick

[19]

[11] Patent Number: 6,094,045

[45] Date of Patent: Jul. 25, 2000

[54] INPUT RANGING CIRCUIT FOR AN ELECTRONIC INSTRUMENT

[75] Inventor: Raymond D. Zoellick, Bothell, Wash.

[73] Assignee: Fluke Corporation, Everett, Wash.

[21] Appl. No.: 08/936,482

[22] Filed: Sep. 18, 1997

[51] Int. Cl.[7] .................................................. G01R 31/28
[52] U.S. Cl. ........................ 324/158.1; 324/115; 324/73.1
[58] Field of Search ................................ 324/121 R, 130, 324/115, 158.1, 114, 482

[56] References Cited

U.S. PATENT DOCUMENTS

| | | | |
|---|---|---|---|
| 4,604,569 | 8/1986 | Tedd et al. | 324/73 R |
| 5,332,963 | 7/1994 | Hightower et al. | 324/123 |
| 5,373,410 | 12/1994 | Schreiber et al. | 361/56 |
| 5,463,315 | 10/1995 | Grace et al. | 324/158.1 |

*Primary Examiner*—Josie Ballato
*Assistant Examiner*—V. Nguyen
*Attorney, Agent, or Firm*—Goerge T. Noe

[57] ABSTRACT

An input ranging circuit for an electronic instrument that allows for measuring a.c. voltage, d.c. voltage, and d.c. resistance is provided. The voltage ranging circuit has three modes, d.c. volts, a.c. volts, and ohms, which are selected by a mode switch. A resistor network containing an input resistor, feedback resistors, a reference resistor, and divider resistors provides resistances that are ratiometrically scaled to maintain relatively tight ratio tolerances. A switch array coupled to the resistor network provides for the selected circuit configuration and divider ratio in conjunction with the mode switch. Each of the switches in the switch array may be independently controlled via control signals. In d.c. volts mode, the input voltage is divided down according to a desired voltage divider ratio. In a.c. volts mode, the voltage divider is supplemented with an a.c. amplifier configured to extend the useful bandwidth of the input ranging circuit. In ohms mode, a programmable current scaled according to the ratio of resistances in the resistor network is induced through an unknown resistance and the voltage drop is provided at an ohms sense output.

8 Claims, 2 Drawing Sheets

INPUT RANGING CIRCUIT FOR AN ELECTRONIC INSTRUMENT

BACKGROUND OF THE INVENTION

This invention relates generally to input circuits for electronic instruments and in particular to an extended bandwidth input ranging circuit for an electronic instrument.

Electronic instruments such as digital multimeters are used for measuring a.c. (alternating current) voltage, d.c. (direct current) voltage, and resistance. The electronic instrument is connected across the voltage to be measured, thus making it desirable to have a very high input impedance to avoid disturbing the voltage level in order to obtain an accurate voltage reading. Because the electronic instrument will likely encounter a wide range of input voltages to measure, it is necessary to provide an input ranging circuit in the front-end of the electronic instrument to scale or divide the input voltage down to a level that is usable for the measurement circuitry, such as an analog to digital converter (ADC).

An electronic instrument is typically specified to make measurements of input voltages that are d.c., a.c. or have mixed d.c and a.c. content. The requirements for input ranging circuits are distinct for d.c. signals as opposed to a.c. signals. The d.c. attenuation is adjusted for an absolute attenuation level. A.C. attenuation, on the other hand, must be within a desired tolerance band over a desired input bandwidth to achieve a specified measurement accuracy for the electronic instrument. The effects of stray capacitance on the impedance of the resistors used in the input ranging circuit often become significant at higher frequencies, particularly for the resistors having high resistance values such as the series input resistor.

Input ranging circuits are well known in the art for use in multimeters, oscilloscopes, and other electronic instruments. U.S. Pat. No. 4,382,227, "Multipurpose Test Equipment Input Circuitry", issued May 3, 1983, to Olivenbaum et al., teaches input circuitry for multipurpose test equipment including a.c. and d.c. coupling paths and a multirange attenuator circuit to couple the input signal to various test circuits. The attenuator circuit provides for selectable divider ratios, either manually or automatically selectable, based on the input voltage level. An input resistor provides the high input impedance to the electronic instrument. A set of divider resistors and shunt capacitors is provided in the attenuator to divide the input voltage down according to a desired divider ratio to accommodate the a.c. and d.c. signal attenuation. A variable capacitor is connected in shunt across the input resistor and is adjusted to balance the capacitance which appears in shunt across the input resistor to obtain extended bandwidth. The capacitive balance must also be accomplished for each of the divider resistors, adding to circuit complexity and manufacturing expense involved in adjusting each variable capacitor.

U.S. Pat. No. 5,332,963 titled "High Input Impedance Buffer With Low Feedback Resistance", issued Jul. 26, 1994, to Hightower et al. discloses the use of a high impedance buffer amplifier in a voltage divider circuit to reduce the need for compensation capacitors and extend the usable bandwidth of the input ranging circuit. The high impedance buffer amplifier allows lower resistances in the divider resistors for the same divider ratio thereby reducing the effects of stray capacitance when measuring a.c. voltages over an extended frequency range and eliminating the need for capacitive balancing in the a.c. path.

The high impedance buffer amplifier taught by Hightower et al. may not be desirable to have in the d.c. path because the active circuitry of the buffer amplifier reduces d.c. measurement accuracy. Thus, separate input ranging circuits for the d.c. and a.c. paths have been created in prior art input ranging circuits that employ the high impedance buffer, thereby creating additional circuit complexity and manufacturing cost. Therefore, it would be desirable to provide an input ranging circuit for an electronic instrument that allows for testing a.c. voltage over an extended frequency range as well as d.c. voltage and d.c. resistance. It would be further desirable that the input ranging circuit be implemented using a resistor array of ratiometrically scaled resistors to obtain enhanced measurement accuracy.

SUMMARY OF THE INVENTION

In accordance with the present invention, an input ranging circuit for an electronic instrument that allows for measuring a.c. voltage, d.c. voltage, and resistance is provided. The input ranging circuit has three modes, d.c. volts, a.c. volts, and ohms, which are selected by a mode switch. A resistor network of ratiometrically scaled resistors, including an input resistor, a set of feedback resistors, a reference resistor, and a set of divider resistors, provides resistances that maintain relatively tight ratio tolerances. In each of the d.c. volts, a.c. volts, and ohms modes, the tight ratiometric tolerances provided by the resistor array provide for enhanced measurement accuracy.

A switch array coupled to the resistor network provides a DIVIDER bus, a SOURCE bus, and a SENSE bus to obtain the selected circuit configuration and divider ratio in conjunction with the mode switch. Each of the switches in the switch array may be independently controlled via control signals, such as control signals generated by a microprocessor in the electronic instrument. The mode switch also selects among an a.c. path, a d.c. path, and an ohms path from an input which receives the input voltage.

In d.c. volts mode, the input voltage is received at the input via the d.c. path and is divided down to a desired divider ratio according the input resistor and a selected divider resistor coupled via the DIVIDER bus. The DC OUT signal is developed at the SENSE bus.

In a.c. volts mode, the voltage divider formed by the input resistor and selected divider resistor is supplemented with an a.c. amplifier configured to reduce the effects of parasitic capacitances and extend the useful bandwidth of the input ranging circuit. Obtaining extended bandwidth means that no capacitive balancing is needed in the input ranging circuit for a desired measurement bandwidth. The AC OUT signal is developed at an output of the a.c. amplifier.

In ohms mode, a programmable current $I_{prog}$ is scaled according to the ratio of the reference resistor to the selected divider resistor. The programmable current $I_{prog}$ is induced through an unknown resistance and the voltage drop is measured at an ohms sense output.

One object of the present invention is to provide an extended bandwidth input ranging circuit for scaling a.c. voltage and d.c. voltage.

Another object of the present invention is to provide an extended bandwidth input ranging circuit for a.c. voltage, d.c. voltage, and resistance.

An additional object of the present invention is to provide an input ranging circuit for d.c. volts, a.c. volts, and resistance using a resistor array having ratiometrically scaled resistors.

Other features, attainments, and advantages will become apparent to those skilled in the art upon a reading of the

DETAILED DESCRIPTION OF THE INVENTION

Figure 1:
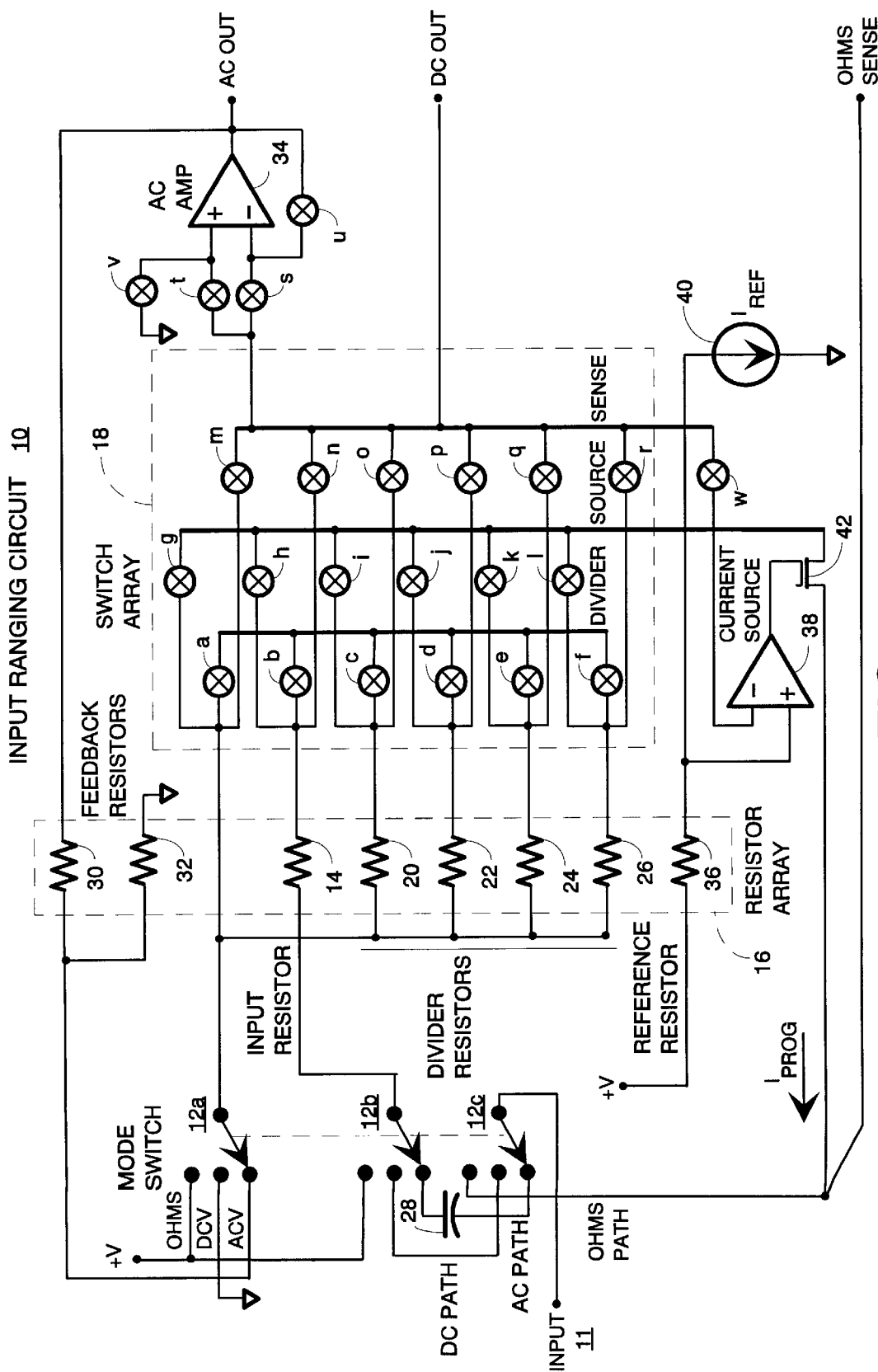
FIG. 1 is a schematic diagram of the input ranging circuit according to the present invention.

FIG. 1 is a schematic diagram of a input ranging circuit 10 according to the present invention. The input ranging circuit 10 has three modes, including d.c. volts mode, a.c. volts mode, and ohms mode, which are selected by a mode switch 12a–c. The mode switch 12a–c is a ganged switch having three positions corresponding to the three modes. An input terminal 11 is coupled to the mode switch 12c and receives an input voltage to be measured. The mode switch 12b–c selects between a DC PATH, an AC PATH, and an OHMS PATH according to the d.c. volts mode, a.c. volts mode, and ohms mode respectively.

In d.c. volts mode, the input voltage received at the input terminal 11 is coupled through the DC PATH to one side of an input resistor 14 in a resistor array 16. The input resistor 14 is typically a very high resistance value in the range of 1 to 10 MegOhms in order to minimize the loading effects of the electronic instrument on the measurement. The other side of the input resistor 14 is coupled to a switch array 18. The switch array contains switches a-f coupled to a DIVIDER bus, switches g–l coupled to a SOURCE bus, and switches m–r coupled to a SENSE bus. Each of the switches a–r is independently controllable via control signals (not shown) preferably generated by a microprocessor or digital controller. Each of the switches a–r typically comprise field effect transistors (FET) or other low leakage electronic switches that are commercially available.

The resistor array 16 is preferably implemented in a monolithic array in which the material comprising each resistor is deposited on a common substrate. Because the accuracy of the voltage scaling directly depends on the accuracy of the ratiometric tolerances of the resistors in the resistor array 16, the full advantage of the present invention may be realized from utilizing the relatively tight ratiometric tolerances between each of the resistors that may be obtained in a monolithic array according to ratiometric scaling. It is desirable that the same resistor array 16 be used for all three modes in the input ranging circuit 10 in order to provide enhanced accuracy ranging for d.c. volts, a.c. volts, and resistance.

The input resistor 14 is coupled to the DIVIDER bus via the switch b. The DIVIDER bus in turn is connected via one of the switches c–f to a selected divider resistor among the set of divider resistors 20–26 according to a selected divider ratio. Each of the divider resistors 20–26 is connected to ground in d.c. volts mode. The set of divider resistors 20–26 typically have values organized by decade values, such as 100 kilohms, 10 kilohms, and 1 kilohms, in order to provide division of the input voltage by decades, such as 10:1, 100:1, and 1000:1 according to a set of divider ratios. The ratiometric scaling of the set of divider resistors with the input resistor allows higher accuracy for the set of divider ratios. The output voltage DC OUT is developed at the SENSE bus which is selectively connected via one of the switches m–r to the junction of the input resistor and selected divider resistor formed by the DIVIDER bus.

Figure 2:
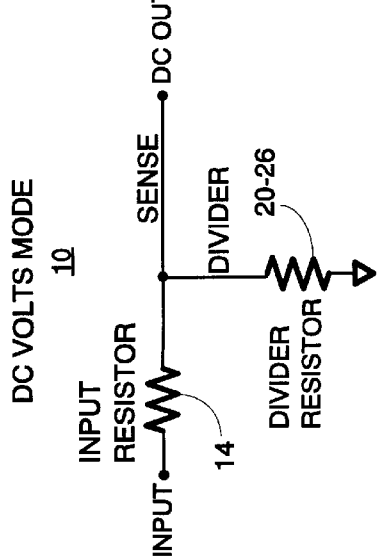
FIG. 2 is a simplified schematic diagram of the input ranging circuit in FIG. 1 configured in a.c. volts mode.

FIG. 2 provides a simplified schematic diagram of the input ranging circuit 10 configured for d.c. volts mode. The input voltage is connected via the input terminal 11 to the input resistor 14 and further to the DIVIDER bus to the selected one of the set of divider resistors 20–26 which are coupled to ground. The output voltage DC OUT is developed via the SENSE bus which is coupled to the junction of the input resistor 14 and the selected divider resistor formed by the DIVIDER bus, and thus equals the ratio of the divider resistor value to the input resistor value times the input voltage.

Referring back to FIG. 1, with the input ranging circuit 10 in a.c. volts mode, the input signal is coupled to the input terminal 11 which is coupled via a capacitor 28 to the input resistor 14. The other side of the input resistor 14 is coupled via the switch b to the DIVIDER bus. The DIVIDER bus in turn is coupled via one of the switches c–f to a selected divider resistor among the set of divider resistors 20–26 according to a selected divider ratio. Each of the divider resistors 20–26 is in turn coupled via switch 12a to the junction of feedback resistors 30 and 32. The other end of the feedback resistor 30 is coupled to an output of an AC amplifier 34. The feedback resistor 32 is coupled to ground. An inverting input of the AC amplifier 34 is coupled via a switch s to the SENSE bus which is selectively connected via one of the switches m–r to the junction of the input resistor 14 and the selected divider resistor formed by the DIVIDER bus.

The output voltage AC OUT is developed at the output of the AC amplifier 34. The feedback resistors 30 and 32 set the gain of the AC amplifier 34 and allow a lower value of divider resistance to be used from the set of divider resistors 20–26 than for the divider resistance required for the same divider ratio in the d.c. volts mode. The junction of the feedback resistors 30 and 32 is an active node by virtue of the operation of the gain of the AC amplifier 34, thereby reducing the effects of parasitic capacitance (not shown) that appear in shunt across the input resistor 14 and each of the divider resistors 20–26, thereby increasing the useful bandwidth of the input ranging circuit 10 and eliminating the need for adjustments and trimming. By using one resistor array 16 with ratiometric scaling for both the d.c. volts mode and the a.c. volts mode, the advantages of reduced component count as well as more predictable ratios between the resistors in the resistor array 16 may be achieved for both the d.c. volts mode and the a.c. volts mode.

In the preferred embodiment, the feedback resistor 30 has a value of 900 ohms and the feedback resistor 32 has a value of 100 ohms which provides for an amplifier gain of 10, thereby reducing the value of the resistance required for one of the divider resistors 20–26 by a decade and proportionately reducing the effects of the parasitic capacitance on the bandwidth. Alternatively, the AC amplifier 34 may be configured for unity gain, operating only as a buffer amplifier for selected divider ranges, by appropriate selection of switches s, t, u, and v, and still achieve some advantage in extended bandwidth. The switches s, t, u, and v are preferably part of the same integrated circuit device comprising the switch array 18. The switch array 18 is preferably constructed using a custom integrated circuit to save component count and manufacturing cost but may also be constructed using commercially available integrated circuits having a number of switches that are coupled together externally.

Figure 3:
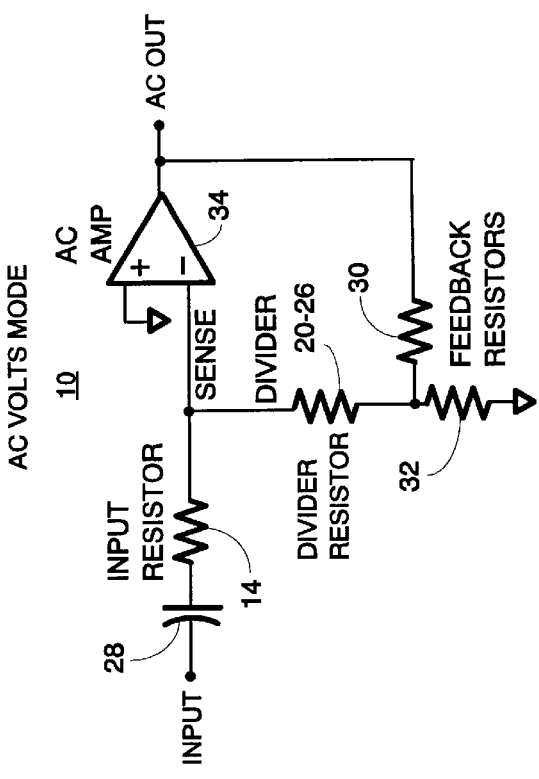
FIG. 3 is a simplified schematic diagram of the input ranging circuit in FIG. 1 configured in d.c. volts mode.

FIG. 3 provides a simplified schematic diagram of the input ranging circuit 10 configured for a.c. volts mode. The input voltage is coupled to the input 11 and further to the capacitor 28 and the input resistor 14. The other side of the input resistor 14 is coupled via the DIVIDER bus to the selected one of the set of divider resistors 20–26, which in turn are coupled to the junction of the feedback resistors 30 and 32. The inverting input of the AC amplifier 34 is coupled to the SENSE bus which is coupled to the junction of the input resistor 14 and the selected one of the set of divider resistors 20–26 formed by the DIVIDER bus. The output voltage AC OUT is developed at the output of the AC amplifier 34 according to the ratio of the divider resistor value to the input resistor value times the gain of the AC amplifier 34. The feedback resistors 30 and 32 are ratiometrically scaled with each other and with the set of divider resistors 20–26 in order to arrive at a more accurate scale factor for the output voltage AC OUT.

Referring back to FIG. 1, with the input ranging circuit 10 in ohms mode, a resistor Rx (not shown) having an unknown resistance is coupled to the input terminal 11 which couples the resistor Rx via an OHMS PATH to a current source and an OHMS SENSE output. The resistor Rx is coupled to receive a programmable current $I_{prog}$ and the voltage drop across the resistor Rx is measured to determine the resistance based on $I_{prog}$ and the voltage drop. The resistor Rx preferably has separate source and sense Kelvin connections (not shown) for enhanced accuracy as is known in the art for resistance measurements.

A reference resistor 36 is coupled between the supply voltage +V and a non-inverting input of an amplifier 38 and further coupled to a current source 40 which produces a reference current $I_{ref}$ to produce a reference voltage $V_{ref}$. A selected one of the set of divider resistors 20–26 is coupled between +V and a transistor 42 via one of switches g–l and the SOURCE bus. An inverting input of the amplifier 38 is coupled via a switch w to the SENSE bus and one of the switches m–r to the transistor 42. An output of the amplifier 38 is coupled to a control input of the transistor 42 to control the amount of current $I_{prog}$ flowing through the transistor 42. The reference resistor 36 is ratiometrically scaled with the set of divider resistors 20–26 to obtain improved accuracy of $I_{prog}$.

Figure 4:
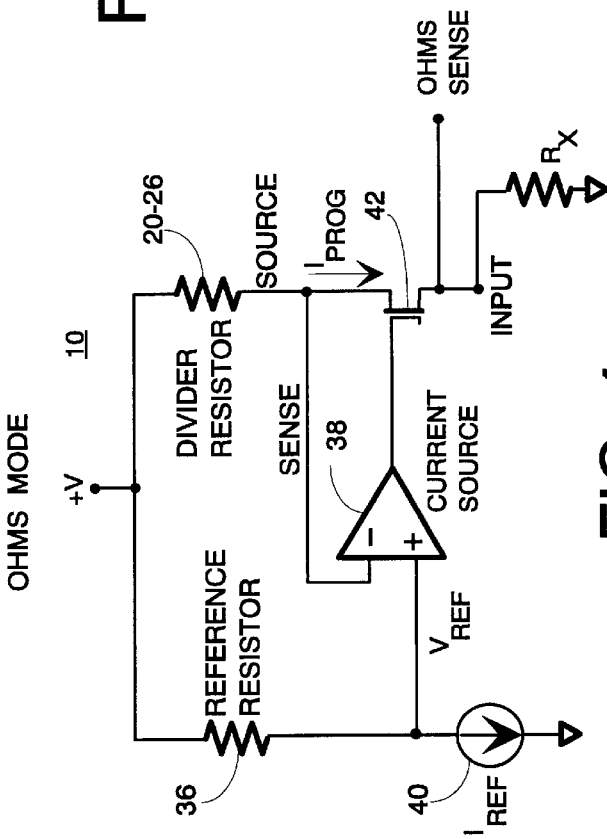
FIG. 4 is a simplified schematic diagram of the input ranging circuit in FIG. 1 configured in ohms mode.

FIG. 4 is a simplified schematic diagram of the input ranging circuit 10 in the ohms mode. The reference resistor 36, amplifier 38, current source 40, divider resistors 20–26, and transistor 42 comprise a current source that produces a current $I_{prog}$ that is scaled according to the ratio of the reference resistor 36 to the selected one of the set of divider resistors 20–26 times the reference current $I_{ref}$. In this way, the accuracy of the current $I_{prog}$ is directly enhanced by the ratiometric accuracy of the resistor array 16. $I_{prog}$ flows through the resistor Rx via the OHMS PATH to produce a voltage drop that is coupled to the OHMS SENSE output. Iprog is thus selected to obtain a scaled voltage level at the OHMS SENSE output in a range that may be readily measured by the electronic instrument.

It will be obvious to those having ordinary skill in the art that many changes may be made in the details of the above described preferred embodiments of the invention without departing from the spirit of the invention in its broader aspects. For example, more than one input resistor may be employed as an alternative input to allow for high impedance isolation, at the expense of bandwidth, or lower input impedance at the expense of isolation. Greater or fewer numbers of divider resistors, either in decade or non-decade values may be selected to obtain selected divider ratios. Switch configurations other than the DIVIDER, SOURCE and SENSE buses may be used to perform signal routing. Relays or other switching devices may be use in place of the mode switch 12a–c. Therefore, the scope of the present invention should be determined by the following claims.

What I claim as my invention is:

1. An input ranging circuit, comprising:
   (a) an input terminal adapted for receiving an input voltage;
   (b) a mode switch coupled to said input terminal for selecting one of an a.c. volts mode, a d.c. volts mode, and an ohms mode;
   (c) a resistor array coupled to said mode switch, said resistor array comprising an input resistor, a reference resistor, a plurality of divider resistors, and a plurality of feedback resistors, said input resistor coupled to said mode switch to receive said input voltage;
   (d) an AC amplifier coupled to said feedback resistors to produce an a.c. output voltage;
   (e) a current source comprising an amplifier coupled to said reference resistor and said plurality of divider resistors to produce a selectable current;
   (f) a switch array coupled to said input resistor, said plurality of divider resistors, and said AC amplifier, said switch array comprising a divider bus, a source bus, and a sense bus, and a plurality of switches coupled between each of said divider bus, said source bus, and said sense bus and said input resistor and said plurality of divider resistors wherein:
      (i) in said d.c. volts mode, a d.c. output voltage is developed from said sense bus coupled to a junction of said input resistor and a selected one of said plurality of divider resistors through said divider bus;
      (ii) in said a.c. volts mode, said a.c. output voltage is developed from said AC amplifier coupled to said junction of said input resistor and said selected one of said plurality of divider resistors through said divider bus and said sense bus; and,
      (iii) in said ohms mode, an said selectable current is provided to said input terminal.

2. An input ranging circuit according to said claim 1 wherein said mode switch further selects one of a d.c. path, an a.c. path, and an ohms path from said input terminal according to said d.c. volts mode, said a.c. volts mode, and said ohms mode.

3. An input ranging circuit according to said claim 1 wherein said input resistor, said reference resistor, said plurality of divider resistors, and said plurality of feedback resistors are ratiometrically scaled.

4. An input ranging circuit, comprising:
   (a) an input terminal for receiving an input voltage;
   (b) a resistor array of selectable ratiometrically scaled resistors;
   (c) a mode switch interposed between said input terminal and said resistor array for selecting one of an a.c. volts mode and a d.c. volts mode;
   (d) an AC amplifier coupled to said resistor array to produce an a.c. output voltage scaled according to selected ratiometrically scaled resistors in response to said input voltage in said a.c. volts mode;
   (e) a d.c. output terminal coupled to said resistor array to produce a d.c. output scaled according to selected ratiometrically scaled resistors in response to said input voltage in said d.c. volts mode; and
   (f) a switch array operatively coupled to said resistor array and to said amplifier and to said d.c. output terminal for selecting said selected ratiometrically scaled resistors.

5. An input ranging circuit in accordance with claim 4 wherein said mode switch further selects an ohms mode.

6. An input ranging circuit in accordance with claim 5 further comprising an amplifier coupled to a reference resistor to form a current source selectably scaled according to said ratiometrically scaled resistors to provide a selectable current to said input terminal in said ohms mode.

7. An input ranging circuit in accordance with claim 4 wherein said resistor array further comprises an input resistor coupled to said input terminal, a plurality of divider resistors selectively coupled to said input resistor by said switch array; and a plurality of feedback resistors selectively coupled to said AC amplifier by said switch array.

8. An input ranging circuit in accordance with claim 7 further comprising a divider bus, a source bus, and a sense bus; wherein said switch array includes a plurality of switches coupled between each of said divider bus, said source bus, and said sense bus and said input resistor and said plurality of divider resistors.

* * * * *